United States Patent
Igarashi

(10) Patent No.: US 11,862,456 B2
(45) Date of Patent: Jan. 2, 2024

(54) METHOD FOR CLEANING SEMICONDUCTOR WAFER

(71) Applicant: SHIN-ETSU HANDOTAI CO., LTD., Tokyo (JP)

(72) Inventor: Kensaku Igarashi, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 17/916,939

(22) PCT Filed: Feb. 18, 2021

(86) PCT No.: PCT/JP2021/006204
§ 371 (c)(1),
(2) Date: Oct. 4, 2022

(87) PCT Pub. No.: WO2021/220590
PCT Pub. Date: Nov. 4, 2021

(65) Prior Publication Data
US 2023/0154742 A1 May 18, 2023

(30) Foreign Application Priority Data
Apr. 28, 2020 (JP) ................................. 2020-078793

(51) Int. Cl.
*H01L 21/02* (2006.01)

(52) U.S. Cl.
CPC .. *H01L 21/02057* (2013.01); *H01L 21/02013* (2013.01)

(58) Field of Classification Search
None
See application file for complete search history.

(56) References Cited

U.S. PATENT DOCUMENTS

2018/0369984 A1   12/2018   Oseki et al.
2020/0020563 A1   1/2020    Nishida et al.

FOREIGN PATENT DOCUMENTS

| CN | 106033711 | * 10/2016 | ....... H01L 21/02057 |
| JP | H08299917 | * 11/1996 | ............... B08B 1/04 |
| JP | 2001-053050 A | 2/2001 | |

(Continued)

OTHER PUBLICATIONS

JPH08299917 English translation, accessed on May 2023. (Year: 1996).*

(Continued)

*Primary Examiner* — Eric W Golightly
*Assistant Examiner* — Arlyn I Rivera-Cordero
(74) *Attorney, Agent, or Firm* — Oliff PLC

(57) ABSTRACT

A method for cleaning a semiconductor wafer to clean a semiconductor wafer after polishing, including: performing a first ozone-water treatment step of cleaning the polished semiconductor wafer with ozone water to form an oxide film; performing a brush cleaning step of brush-cleaning the semiconductor wafer with carbonated water after the first ozone-water treatment step; and then performing a second ozone-water treatment step including cleaning the semiconductor wafer with hydrofluoric acid to remove the oxide film, followed by cleaning with ozone water to form an oxide film again. This second ozone-water treatment step is performed one or more times.

8 Claims, 2 Drawing Sheets

(56) References Cited

FOREIGN PATENT DOCUMENTS

| JP | 2002-203824 | A | 7/2002 | |
|---|---|---|---|---|
| JP | 2007073806 | * | 3/2007 | ........... H01L 21/304 |
| JP | 2017-104946 | A | 6/2017 | |
| JP | 2018-133414 | A | 8/2018 | |
| JP | 2020-061483 | A | 4/2020 | |
| WO | 2018/180018 | A1 | 10/2018 | |

OTHER PUBLICATIONS

JP2007073806 English translation, accessed on May 2023. (Year: 2007).*
CN106033711 English translation, accessed on May 2023. (Year: 2016).*
JP2002203824 English translation, accessed on May 2023. (Year: 2002).*
JP2001053050 English translation, accessed on May 2023. (Year: 2001).*
JP2020061483 English translation, accessed on May 2023. (Year: 2020).*
Apr. 20, 2021 International Search Report issued in International Patent Application No. PCT/JP2021/006204, 3 pages.
Oct. 27, 2022 International Preliminary Report on Patentability issued in International Application No. PCT/JP2021/006204 5 pages.

* cited by examiner

[FIG. 1]
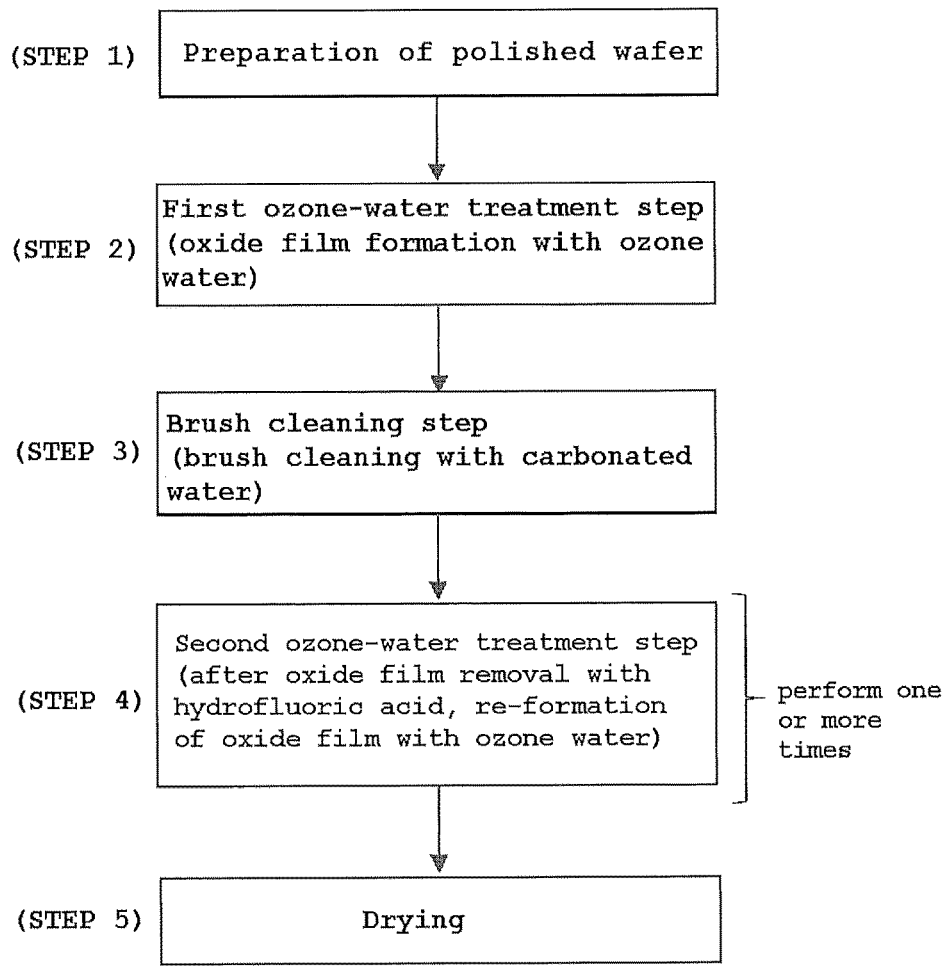
[FIG. 2]
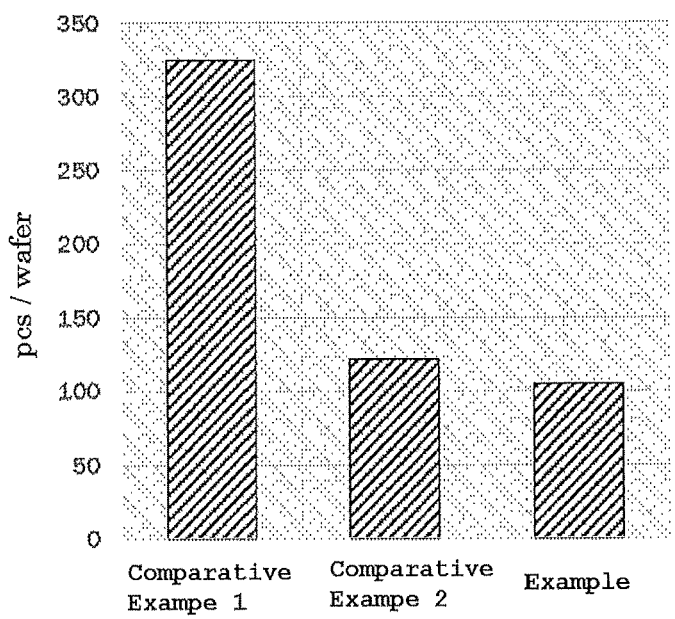

[FIG. 3]
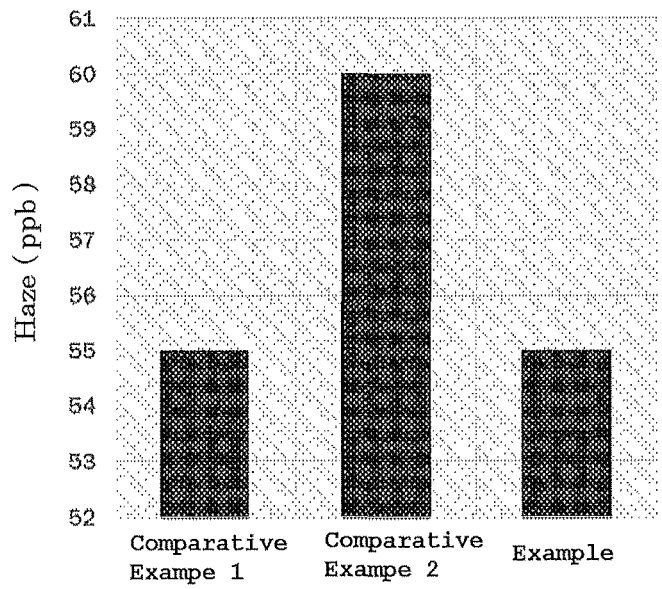
[FIG. 4]
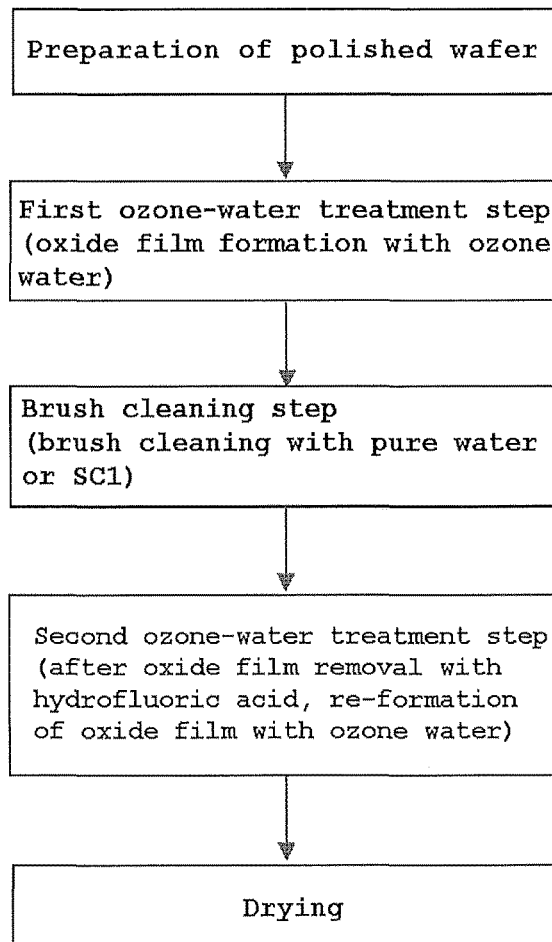
Related Art

METHOD FOR CLEANING SEMICONDUCTOR WAFER

CROSS REFERENCE TO RELATED APPLICATIONS

This application is a national stage of PCT patent application number PCT/JP2021/006204 filed on Feb. 18, 2021, which in turn claims priority to JP 2020-078793 filed on Apr. 28, 2020.

TECHNICAL FIELD

The present invention relates to a method for cleaning a semiconductor wafer.

BACKGROUND ART

Conventionally, when a semiconductor wafer (referred to as simply wafer also) having a polishing agent adhered to the wafer surface immediately after polishing is cleaned in a batch (cleaned by dipping), it has been common to perform cleaning using SC1 (a mixed solution of ammonia water and hydrogen peroxide water) in order to remove organic matter or silica particles contained in the polishing agent, etc. (see, for example, Patent Document 1).

In a conventional cleaning flow as shown in FIG. 4, a polished wafer is treated with ozone water and then cleaned using a brush with pure water or SC1 to remove a polishing agent. Subsequently, particles and metal contaminants are removed through oxide film removal with hydrofluoric acid, and an oxide film is formed by reoxidation with ozone water. Further, drying is performed thereafter.

CITATION LIST

Patented Literature

Patent Document 1: JP 2017-104946 A

SUMMARY OF INVENTION

Technical Problem

As described above, in the conventional brush cleaning after polishing, it is common to perform the brush cleaning with pure water or SC1 after oxide film formation with ozone water (after the first ozone-water treatment step).

However, there are problems that the ability of pure water to remove particles is low, and that particles adhere due to electrification caused by friction between the brush and the wafer.

In addition, SC1 is a chemical solution that is accompanied by anisotropic etching, and there have been problems that projecting defects are generated on a wafer surface, and that surface roughness is degraded. Further, a chemical like SC1 has a high environmental load and requires wastewater treatment, and requires a temperature adjustment mechanism, bringing about a problem of quite high cost.

Accordingly, the present invention has been made in view of such problems. An object of the present invention is to provide a method for cleaning a semiconductor wafer in such a manner as to achieve cleaning level equivalent to that with SC1, and to reduce or prevent defect generation on a wafer surface and degradation of surface roughness which would otherwise occur when SC1 is used. Another object is to provide a method for cleaning a semiconductor wafer by which cost reduction and environmental load reduction are achieved in comparison with the conventional art.

Solution to Problem

To achieve the objects, the present invention provides a method for cleaning a semiconductor wafer to clean a semiconductor wafer after polishing, the method comprising:

performing a first ozone-water treatment step of cleaning the polished semiconductor wafer with ozone water to form an oxide film;

performing a brush cleaning step of brush-cleaning the semiconductor wafer with carbonated water after the first ozone-water treatment step; and then performing a second ozone-water treatment step including cleaning the semiconductor wafer with hydrofluoric acid to remove the oxide film, followed by cleaning with ozone water to form an oxide film again, wherein the second ozone-water treatment step is performed one or more times.

According to such a method for cleaning a semiconductor wafer, the use of carbonated water reduces electrification and particle adhesion in the brush cleaning, so that a cleaning level equivalent to that with SC1 can be achieved.

Moreover, since the brush cleaning is performed wither such a cleaning solution as carbonated water which is not accompanied by etching, this makes it possible to reduce defect generation on the wafer surface and prevent surface roughness degradation unlike conventional brush cleaning with SC1.

Further, the use of carbonated water and ozone water enables the treatments at normal temperature, so that cost reduction is possible. Furthermore, the wastewater treatment for carbonated water is easy relative to SC1, and the reuse is possible. Thus, the environmental load can be reduced.

Additionally, in the first ozone-water treatment step and the brush cleaning step, the ozone water and the carbonated water can be at normal temperature and can have a pH of 7.0 or less.

The use of such ozone water in the first ozone-water treatment step enables organic matter removal and oxide film formation more easily and effectively. Moreover, the use of such carbonated water in the brush cleaning step enables defect generation reduction on the wafer surface and prevention of surface roughness degradation more reliably.

Further, in the brush cleaning step, the carbonated water can have a concentration of 100 ppm or more and 1000 ppm or less.

When the concentration of the carbonated water is 100 ppm or more, more sufficient cleaning effect can be obtained in the brush cleaning. Meanwhile, when the concentration is 1000 ppm or less, it is possible to suppress bubbling and its adverse influence during the cleaning.

Further, in each of the first and second ozone-water treatment steps, the ozone water can have a concentration of 10 ppm or more and 50 ppm or less.

When the concentration of the ozone water is 10 ppm or more, this makes it possible to more effectively remove organic matter and more reliably improve the wafer quality. Meanwhile, when the concentration is 50 ppm or less, it is possible to prevent formation of too thick oxide film.

Further, the oxide films formed in the first and second ozone-water treatment steps can have a thickness of 0.8 nm or more and 1.5 nm or less.

When the thickness of the oxide films is 0.8 nm or more, this enables sufficient removal of organic matter and metal contamination derived from the polishing agent. Meanwhile, when the thickness is 1.5 nm or less, this can shorten the time required for the step of removing the oxide film thus formed.

Further, in the second ozone-water treatment step, the hydrofluoric acid can have a concentration of 1.0% or less.

With the hydrofluoric acid concentration of 1.0% or less, the time required for oxide film removal is not too short, and thus it is not difficult to control the time.

Furthermore, the second ozone-water treatment step can be performed by spin cleaning or batch cleaning.

Such cleaning methods are generally carried out, and the oxide film removal and formation can be carried out individually or simultaneously.

Furthermore, among waste liquids generated in each of the steps, waste liquids of the ozone water and the carbonated water may be collected and reused.

Recycling the waste liquids in this manner can lead to further cost reduction and environmental load reduction.

Furthermore, the semiconductor wafer may be a silicon wafer.

The inventive cleaning method is particularly suitable for silicon wafers because carbonated water that is not accompanied by silicon etching is used in the brush cleaning.

Advantageous Effects of Invention

As described above, according to the inventive method for cleaning a semiconductor wafer, the use of carbonated water makes it possible to reduce electrification and particle adhesion during the brush cleaning and to achieve a cleaning level equivalent to that with SC1. Moreover, it is possible to reduce defect generation on the wafer surface and prevent surface roughness degradation which occur if SC1 is used instead. Further, the normal-temperature treatment, easiness of wastewater treatment, and reusability of the waste liquids can lead to cost reduction and environmental load reduction.

BRIEF DESCRIPTION OF DRAWINGS

FIG. 1 is a flowchart showing an outline of the inventive method for cleaning a semiconductor wafer.
FIG. 2 is a graph showing the number of particles on cleaned wafers in Example and Comparative Examples 1, 2.
FIG. 3 is a graph showing the haze values of the cleaned wafers in Example and Comparative Examples 1, 2.
FIG. 4 is a flowchart showing an outline of a conventional method for cleaning a semiconductor wafer.

DESCRIPTION OF EMBODIMENTS

The present inventor has earnestly studied to solve the above-described problems in polished-wafer cleaning, and consequently found that when brush-cleaning is performed with carbonated water in a brush cleaning step, electrification and particle adhesion by brush cleaning are reduced, and cleaning level equivalent to that with SC1 can be achieved. Moreover, an alkaline chemical solution like SC1 is not used but carbonated water is used to clean the wafer on the entire surface of which a polishing agent immediately after polishing still adheres. This makes it possible to reduce defects on the wafer and prevent surface roughness degradation.

Further, the inventor has found that carbonated water and ozone water allow treatments at normal temperature and recycling of waste liquids thereof, thereby leading to cost reduction and environmental load reduction. These findings have led to the completion of the present invention.

Hereinafter, an example of embodiments according to the present invention will be described with reference to the drawings in detail, but the present invention is not limited thereto.

FIG. 1 is a flowchart showing an outline of the inventive method for cleaning a semiconductor wafer.

First, a wafer is prepared with a polishing agent immediately after polishing, the polishing agent adhering on the entire surface of the wafer (Step 1). The type of the wafer is not particularly limited, but is here a silicon wafer. Herein, the conditions under which the polishing is performed on the wafer are not particularly limited. As the polishing agent, it is possible to use silica. Particularly, the silica particle size is such that the primary particle diameter is 10 to 35 nm, and the silica concentration is 0.01 to 1.0 mass %. This silica can be removed by a brush cleaning step and a second ozone-water treatment step (particularly cleaning using hydrofluoric acid) to be described below.

Next, as in Step 2 of FIG. 1, the silicon wafer having a polishing agent immediately after polishing adhering on the entire surface is cleaned with ozone water in a first ozone-water treatment step. Thereby, organic matter of the adhering polishing agent is decomposed and removed, and an oxide film is formed. The cleaning method here is not particularly limited, as long as ozone water is used, and can be, for example, brush cleaning or spin cleaning.

In this event, the ozone water may be at normal temperature and may have a pH of 7.0 or less. Such a material enables more easy and effective organic matter removal and oxide film formation. Additionally, the lower limit value of the pH of this ozone water is not particularly limited, and can be, for example, 0.

Further, the ozone water may have a concentration of 10 ppm or more and 50 ppm or less. With the ozone water concentration of 10 ppm or more, this enables further effective removal of the organic matter, and the wafer quality can be improved more reliably. Meanwhile, with the concentration of 50 ppm or less, it is possible to prevent the formation of excessively thick oxide film.

Furthermore, the oxide film formed in this event may have a thickness of 0.8 nm or more and 1.5 nm or less. With the oxide film thickness of 0.8 nm or more, it is possible to more sufficiently remove the organic matter and metal contamination attributable to the polishing agent. Meanwhile, with the thickness of 1.5 nm or less, it is possible to shorten the time for a step of removing the formed oxide film.

Next, as in Step 3 of FIG. 1, brush cleaning (physical cleaning) is performed with carbonated water. By this brush cleaning step, the polishing agent is removed.

In this event, the carbonated water may be at normal temperature and may have a pH of 7.0 or less. Such a material enables more reliable reduction of defect generation on the wafer surface and prevention of surface roughness degradation. Additionally, the lower limit value of the pH of this carbonated water is not particularly limited, and can be, for example, 0.

Moreover, the carbonated water may have a concentration of 100 ppm or more and 1000 ppm or less. With the carbonated water concentration of 100 ppm or more, further sufficient cleaning effect by the brush cleaning can be obtained. Meanwhile, with the concentration of 1000 ppm or less, bubbling during the cleaning and its adverse influence can be suppressed.

Next, as in Step 4 of FIG. 1, a second ozone-water treatment step is performed which includes: removing the oxide film with hydrofluoric acid to remove metal contamination; and then forming an oxide film again with ozone water. This second ozone-water treatment step is performed one or more times. The upper limit of the number of times the second ozone-water treatment step is performed is not particularly limited. Moreover, since it depends on the extent of the metal contamination, and so forth, the maximum number of the treatments performed cannot be limited.

In this event, as in the first ozone-water treatment step, the ozone water may have a concentration of 10 ppm or more and 50 ppm or less. Further, the oxide film thus formed may have a thickness of 0.8 nm or more and 1.5 nm or less.

Furthermore, the hydrofluoric acid may have a concentration of 1.0% or less. With the hydrofluoric acid concentration of 1.0% or less, the time for the oxide film removal is not too short, so that it is not difficult to control the time. Additionally, the lower limit of the hydrofluoric acid concentration can be, for example, higher than 0%.

Furthermore, the oxide film removal with hydrofluoric acid and the oxide film formation with ozone water may be carried out by spin cleaning or batch cleaning. Such cleaning methods are commonly performed and suitable. The oxide film removal and formation can be carried out individually or plural simultaneously.

Furthermore, among waste liquids generated in each of the above steps, waste liquids of the ozone water and the carbonated water can be collected and reused. The re-uses of these waste liquids can lead to further cost reduction and environmental load reduction.

Further, a drying step is performed thereafter (Step 5). Thus, the cleaning is ended.

EXAMPLE

Hereinafter, the present invention will be more specifically described with reference to Example and Comparative Examples. However, the present invention is not limited to Example.

Example

According to the cleaning flow of the present invention as shown in FIG. 1, the first ozone-water treatment step was performed with ozone water on a polished silicon wafer which had a polishing agent adhering thereon. Then, the brush cleaning step was performed with carbonated water. Subsequently, the second ozone-water treatment step was performed once by spin cleaning with hydrofluoric acid and ozone water, followed by the drying treatment. These steps were performed under the following conditions.

First ozone-water treatment step: ozone water concentration=30 ppm, pH=5.0
Brush cleaning step: carbonated water concentration=100 ppm, pH=4.0
Second ozone-water treatment step: hydrofluoric acid concentration=1.0 mass %, pH=3.0; ozone water concentration=30 ppm, pH=5.0

Comparative Examples 1, 2

Cleaning was carried out as in Example, except that the brush cleaning step was performed with pure water (Comparative Example 1) or SC1 (Comparative Example 2) according to the cleaning flow as shown in FIG. 4.

Note that, in Example and Comparative Example 1, among waste liquids generated in the steps, waste liquids of the ozone water, the carbonated water or the pure water were collected and reused.

In the wafer evaluation of Example and Comparative Examples 1, 2, particles with diameters of 19 nm or more on the cleaned wafers were measured using a wafer inspection system SP5 manufactured by KLA-Tencor Corporation. FIG. 2 and Table 1 show the measurement result.

Moreover, regarding the haze value, Original Std. Classic Average of DW2 was used. FIG. 3 and Table 1 show the measurement result.

TABLE 1

|  | Chemical solution used | The number of particles | Haze (ppb) |
| --- | --- | --- | --- |
| Comparative Example 1 | pure water | 325 | 55 |
| Comparative Example 2 | SC1 | 122 | 60 |
| Example | carbonated water | 105 | 55 |

As shown in FIG. 2 and Table 1, in Example, the number of particles was improved in comparison with Comparative Example 1 using pure water in the brush cleaning step. Example achieved the cleaning level equivalent to or higher than that of Comparative Example 2 using SC1.

Moreover, as shown in FIG. 3 and Table 1, the haze (surface roughness) degradation as in Comparative Example 2 using SC1 was not observed in Example.

Further, as in the case of pure water in Comparative Example 1, collecting and reusing the waste liquid of carbonated water used in Example successfully led to cost reduction and environmental load reduction.

It should be noted that the present invention is not limited to the above-described embodiments. The embodiments are just examples, and any embodiments that substantially have the same feature and demonstrate the same functions and effects as those in the technical concept disclosed in claims of the present invention are included in the technical scope of the present invention.

The invention claimed is:

1. A method for cleaning a semiconductor wafer to clean a semiconductor wafer after polishing, the method comprising:
    performing a first ozone-water treatment step of cleaning the polished semiconductor wafer with ozone water to form an oxide film;
    performing a brush cleaning step of brush-cleaning the semiconductor wafer with carbonated water having a concentration of 100 ppm or more and 1000 ppm or less after the first ozone-water treatment step; and
    then performing a second ozone-water treatment step including cleaning the semiconductor wafer with hydrofluoric acid to remove the oxide film, followed by cleaning with ozone water to form an oxide film again, wherein the second ozone-water treatment step is performed one or more times.

2. The method for cleaning a semiconductor wafer according to claim 1, wherein in the first ozone-water treatment step and the brush cleaning step, the ozone water and the carbonated water are at room temperature and have a pH of 7.0 or less.

3. The method for cleaning a semiconductor wafer according to claim 1, wherein in each of the first and second ozone-water treatment steps, the ozone water has a concentration of 10 ppm or more and 50 ppm or less.

4. The method for cleaning a semiconductor wafer according to claim 1, wherein the oxide films formed in the first and second ozone-water treatment steps have a thickness of 0.8 nm or more and 1.5 nm or less.

5. The method for cleaning a semiconductor wafer according to claim 1, wherein in the second ozone-water treatment step, the hydrofluoric acid has a concentration of 1.0% or less.

6. The method for cleaning a semiconductor wafer according to claim 1, wherein the second ozone-water treatment step is performed by spin cleaning or batch cleaning.

7. The method for cleaning a semiconductor wafer according to claim 1, wherein among waste liquids generated in each of the steps, waste liquids of the ozone water and the carbonated water are collected and reused.

8. The method for cleaning a semiconductor wafer according to claim 1, wherein the semiconductor wafer is a silicon wafer.

* * * * *